United States Patent
Turski et al.

(10) Patent No.: US 11,476,383 B2
(45) Date of Patent: Oct. 18, 2022

(54) PLATFORMS ENABLED BY BURIED TUNNEL JUNCTION FOR INTEGRATED PHOTONIC AND ELECTRONIC SYSTEMS

(71) Applicant: Cornell University, Ithaca, NY (US)

(72) Inventors: Henryk Turski, Warsaw (PL); Debdeep Jena, Ithaca, NY (US); Huili Grace Xing, Ithaca, NY (US); Shyam Bharadwaj, Ithaca, NY (US); Alexander Austin Chaney, Ithaca, NY (US); Kazuki Nomoto, Ithaca, NY (US)

(73) Assignee: Cornell University, Ithaca, NY (US)

( * ) Notice: Subject to any disclaimer, the term of this patent is extended or adjusted under 35 U.S.C. 154(b) by 250 days.

(21) Appl. No.: 16/966,775

(22) PCT Filed: Jan. 31, 2019

(86) PCT No.: PCT/US2019/015991
§ 371 (c)(1),
(2) Date: Jul. 31, 2020

(87) PCT Pub. No.: WO2019/152611
PCT Pub. Date: Aug. 8, 2019

(65) Prior Publication Data
US 2021/0043795 A1    Feb. 11, 2021

Related U.S. Application Data

(60) Provisional application No. 62/625,502, filed on Feb. 2, 2018.

(51) Int. Cl.
*H01L 33/00* (2010.01)
*H01L 33/06* (2010.01)
(Continued)

(52) U.S. Cl.
CPC ........ *H01L 33/0075* (2013.01); *H01L 33/007* (2013.01); *H01L 33/06* (2013.01);
(Continued)

(58) Field of Classification Search
CPC ......... H01L 33/38; H01L 33/06; H01L 33/20; H01L 33/0004; H01L 33/0075;
(Continued)

(56) References Cited

U.S. PATENT DOCUMENTS 10,079,473 B2   9/2018  Kondo
2008/0111144 A1  5/2008  Fitchenbaum
(Continued)

FOREIGN PATENT DOCUMENTS

EP    3410496 A1   12/2018
WO    18035322 A1   2/2018

OTHER PUBLICATIONS

Simon et al., Polarization-Induced Zener Tunnel Junctions in Wide-Band-Gap Heterostructures, Phys. Rev. Letters, Aug. 2009.
(Continued)

*Primary Examiner* — Savitri Mulpuri
(74) *Attorney, Agent, or Firm* — Culhane Meadows PLLC; Orlando Lopez

(57) ABSTRACT

A device that includes a metal(III)-polar III-nitride substrate having a first surface opposite a second surface, a tunnel junction formed on one of the first surface or a buffer layer disposed on the first surface, a p-type III-nitride layer formed directly on the tunnel junction, and a number of material layers; a first material layer formed on the p-type III-nitride layer, each subsequent layer disposed on a preceding layer, where one layer from the number of material layers is patterned into a structure, that one layer being a III-nitride layer. Methods for forming the device are also disclosed.

4 Claims, 8 Drawing Sheets

(51) Int. Cl.
   *H01S 5/22*   (2006.01)
   *H01S 5/30*   (2006.01)
   *H01L 33/32*  (2010.01)
   *H01L 33/12*  (2010.01)

(52) U.S. Cl.
   CPC .............. *H01L 33/12* (2013.01); *H01L 33/32* (2013.01); *H01S 5/2206* (2013.01); *H01S 5/2216* (2013.01); *H01S 5/3095* (2013.01)

(58) Field of Classification Search
   CPC ........... H01L 2933/0083; H01L 33/007; H01L 33/04; H01L 33/0025; H01L 33/02; H01L 33/12; H01L 33/325; H01L 33/0062; H01L 33/025; H01L 33/32; H01L 33/30; H01S 5/3095; H01S 5/2206; H01S 5/2216
   See application file for complete search history.

(56) References Cited

U.S. PATENT DOCUMENTS

2013/0270514 A1   10/2013   Saxler
2018/0323338 A1   11/2018   Grundmann

OTHER PUBLICATIONS

Ž. Gačević et al., Emission of Linearly Polarized Single Photons from Quantum Dots Contained in Nonpolar, Semipolar, and Polar Sections of Pencil-Like InGaN/GaN Nanowires, ACS Photonics, 4 (2017) 657-664.
M.J. Holmes et al., Room-temperature triggered single photon emission from a III-nitride site-controlled nanowire quantum dot, Nano Lett, 14 (2014) 982-986.
T.T. Tran et al., Robust Multicolor Single Photon Emission from Point Defects in Hexagonal Boron Nitride, ACS Nano, 10 (2016) 7331-7338.
A. Yariv, Optical Electronics, Chapter 5, third edition, pp. 123-139, Holt, Rinehart and Winston, Inc.

US 11,476,383 B2

PLATFORMS ENABLED BY BURIED TUNNEL JUNCTION FOR INTEGRATED PHOTONIC AND ELECTRONIC SYSTEMS

CROSS-REFERENCE TO RELATED APPLICATIONS

This application is a U.S. national stage application under 35 U.S.C. 371 of International Application No. PCT/US19/015991 filed on Jan. 31, 2019 and entitled PLATFORMS ENABLED BY BURIED TUNNEL JUNCTION FOR INTEGRATED PHOTONIC AND ELECTRONIC SYSTEMS, which in turn claims priority to U.S. Provisional Patent Application No. 62/625,502, filed Feb. 2, 2018, which is incorporated herein by reference in its entirety and for all purposes.

BACKGROUND OF THE INVENTION

1. Field of the Invention

The subject disclosure relates to devices comprising a number of material layers, where one layer is patterned into a structure and more particularly to platforms enabled by buried tunnel junctions for integrated photonic and electronic devices.

2. Background of the Related Art

Photonic devices fabricated using the Gallium Nitride (GaN) and related family of semiconductors (III-nitrides), such as light emitting diodes (LEDs) and laser diodes (LDs) are the only solid-state devices that are able to emit light at green, blue, and ultraviolet wavelengths with very high efficiency. Such photonic devices are mature, and produced on a large scale for solid state lighting, optical storage, and communications.

LEDs still face a major restriction: the injected current must be kept below a certain density to avoid an efficiency droop. This restricts the total amount of light emitted per unit area, and thus places an upper limit on the efficient usage of the wafer area.

GaN based transistors are rapidly replacing older technologies for microwave communications, and for high voltage power electronics. What is common for all these photonic and electronic devices is that these devices are all grown along the [0001] Ga-polar direction of the semiconductor crystal. The main reason for the lack of non-polar and semi-polar plane devices (with an exception of LEDs and LDs introduced by Soraa and UC Santa Barbara), is the very limited availability of large area substrates for the growth. On the other hand, only a few reports have shown devices grown along the opposite [000-1] N-polar direction of the semiconductor crystal, which relies on the same type of substrates as [0001] Ga-polar growth, implying availability is not the major reason impeding the adoption of this substrate orientation.

N-polar grown structures with buried n-layers, and p-type layers on the top promise to have the internal electric fields in the active quantum well regions that originate due to spontaneous and piezoelectric polarization aligned along the p-n diode junction field in the forward bias. This fact should result in a higher injection efficiency for LEDs, and lower threshold currents for LDs. For the same reason, such structures also promise a smaller depletion width for In(Ga)N tunnel diodes grown along this direction.

Problems blocking development of N-polar devices are: more challenging growth specifics that leads to higher oxygen contamination of grown layers; and lower chemical stability (compared to layers grown along Ga-polar direction) that makes surface treatment, etching, and post growth processing problematic.

Another problem in III-nitride semiconductors is a large asymmetry between n-type and p-type materials. Due to the low ionization efficiency of Mg in nitrides (p-type acceptor dopant) and the low mobility of holes, the resistance of p-type layers (both vertical and lateral) and contacts to p-type material is orders of magnitude higher than for their n-type counterparts. This feature poses a severe hurdle for several applications of nitride devices that rely on efficient lateral injection of carriers through the top (p-type) patterned surface.

SUMMARY

In view of the above, a need exists for technology to make etching, and post growth processing not problematic when manufacturing photonic and electronic devices.

In one or more embodiments, the device of these teachings includes a metal(III)-polar III-nitride substrate having a first surface opposite a second surface, a tunnel junction formed on one of the first surface or a buffer layer disposed on the first surface, a p-type III-nitride layer formed directly on the n-type layer to form the tunnel junction, and a number of material layers; a first material layer formed on the buried p-type III-nitride layer, each subsequent layer disposed on a preceding layer, where one layer from the number of material layers is patterned into a structure, that one layer being a III-nitride layer.

In one instance, the device is an LED, where the first material layer is an active layer including at least one quantum well, and the second, and last, material layer is an n-type III-nitride layer formed directly on the active layer. A portion of the second material layer, extending from above the active layer, is patterned into nanopillars.

In one or more embodiments, the LED with a patterned n-type III-nitride layer of these teachings is formed by growing, by a crystal growth method, a tunnel junction on a metal (III)-polar n-type III-nitride substrate, growing, by the crystal growth method, a p-type III-nitride layer on the n-type layer to form the tunnel junction, growing an active region, including at least one quantum well layer, on the p type III-nitride layer, and growing an n type III-nitride layer on the active region; and etching the n type III-nitride layer in order to pattern the n type III-nitride layer into a structure.

A number of other embodiments are also disclosed.

It should be appreciated that the subject technology can be implemented and utilized in numerous ways, including without limitation as a process, an apparatus, a system, a device, a method for applications now known and later developed. These and other unique features of the system disclosed herein will become more readily apparent from the following description and the accompanying drawings.

BRIEF DESCRIPTION OF THE DRAWINGS

So that those having ordinary skill in the art to which the disclosed technology appertains will more readily understand how to make and use the same, reference may be had to the following drawings.

DETAILED DESCRIPTION

Figure 1:
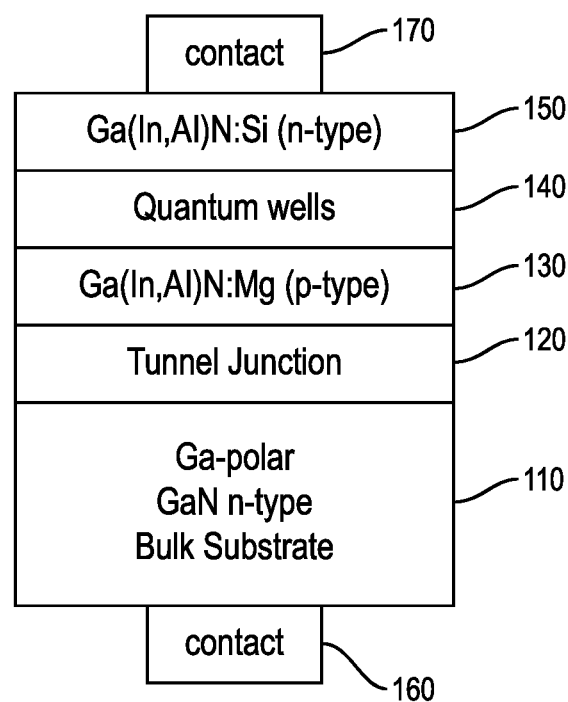
FIG. 1 is a schematic diagram of an LED in accordance with the subject disclosure.

The subject technology overcomes many of the prior art problems associated with the development of N-polar devices. The advantages, and other features of the technology disclosed herein, will become more readily apparent to those having ordinary skill in the art from the following detailed description of certain preferred embodiments taken in conjunction with the drawings which set forth representative embodiments of the present technology and wherein like reference numerals identify similar structural elements. Directional indications such as upward, downward, right, left, bottom, top and the like are used with respect to the figures and not meant in a limiting manner.

Group III, as used herein, refers to CAS Group IIIA (Triels or the Boron group) in the periodic table.

III-nitride semiconductor materials, as used herein, refers to (Al, In, Ga and their alloys)N.

"Buffer layer," as used herein, refers to III-nitride layer that does not affect the performance of the device.

An "Ohmic contact," as used herein, refers to a low resistance junction that provides current conduction from metal to semiconductor and vice versa.

In brief overview, in the subject technology, a solution to all of the above problems is demonstrated by the use of buried tunnel junction grown below the structure of interest (p-n diode, light emitting diode, laser diode, tunnel diode etc.). In this way, by using n-type Ga-polar substrates that are very widely available in high quality and low price, the resulting devices profit from the same polarization field direction with respect to p-n diode bias as those grown on N-polar substrates. Furthermore, the top most layer will be n-type. The n-type top layer unleashes several advantages by making possible a vertical device that:

is grown along the [0001] Ga-polar so the layer does not suffer from challenges present for [000-1] growth;
is chemically resistant, like all Ga-polar devices, and can be easily patterned into nanostructure, photonic crystals, nanowires, waveguides, and other geometries;
the patterning would be performed in highly conductive n-type material that would enable carrier injection through a side contact placed on the top;
etching within the n-type material will not limit the area of current spreading so the etching can reach very close to active region
has an ohmic bottom contact supplied by a buried tunnel junction through the low resistive n-type substrate;
can work over a wide range of temperatures including at low temperatures;
has all the features of N-polar device with ohmic contact at the N-polar surface (here through the bottom tunnel junction); and
allows for direct integration of III-nitride (such as GaN) electronics with light-emitting diode and laser structures.

As shown in FIG. 1 below, the placement of tunnel junction is below the quantum heterostructure. This placement enables significant freedom in patterning or processing of the crystal surface. For example, for LEDs etching within top most n-type layer will not limit the area of current spreading so the etching the top most n-type layer can reach very close to active region.

Referring to FIG. 1, in the embodiment shown there in, the device (LED) has a Ga (metal (III))-polar, III-nitride (GaN) n-type substrate 110 and a tunnel junction 120 disposed on one surface of the Ga (metal (III))-polar, III-nitride (GaN) n-type substrate 110. The tunnel junction 120 can, in one embodiment, include a layer disposed on the substrate introduced to induce polarization (as in Simon et al., Polarization-Induced Zener Tunnel Junctions in Wide-Band-Gap Heterostructures, Phys. Rev. Letters, August 2009 or Grundmann et al, Tunnel Junctions in GaN/AlN for Optoelectronic Applications, 2005 Device Research Conference IEEE, or US Patent Application Publication Number 20080078439, entitled Polarization-Induced Tunnel Junction, filed Jun. 25, 2007, all of which are incorporated by reference here in in their entirety and for all purposes). In an alternative embodiment, the subject technology is used for tunnel junction construction but instead of using a simple GaN:Mg/GaN:Si homojunction, an AlGaN or AlN interlayer is used between p-type and n-type layers to shrink the depletion region by adding polarization field inside the structure. A p type III-nitride layer 130 (a p-type GaN layer in the embodiment shown) is disposed on the tunnel junction 120. An active layer 140, including at least one quantum well, is disposed on the p type III-nitride layer 130. An n-type III-nitride layer 150 (an n-type GaN layer in the embodiment shown) is disposed on the active layer 140. A first ohmic contact 160 is disposed on another surface of the Ga (metal (III))-polar, III-nitride (GaN) n-type substrate 110. A second ohmic contact 170 is disposed on one surface of the n-type III-nitride layer 150.

The use of tunnel junction below the heterostructure also opens the possibility of obtaining structures that would in other situations rely on the growth on top of N-polar substrate (like InGaN-based tunnel field effect transistors). In this approach though, the grown layer is metal-polar that leads to more chemically controllable processing and possibility of patterning the top most layer (which is n-type comparing to p-type for N-polar growth).

In one embodiment, a portion of the n-type III-nitride layer 150, extending from above the active layer 140, is patterned into nanopillars. In some instances, embodiments in which a portion of the n-type III-nitride layer 150, extending from above the active layer 140, is patterned into nanopillars enable the use of electroluminescence from LED to optically stimulate material with unique optical properties that is placed on top of the nanopillars. Parameters of materials that are optically stimulated often depend on shape of the material. In embodiments using buried tunnel junction, such as the embodiment shown in FIG. 1, there is a capability to change the surface of the device without introducing roughness under the top metal contact. The high conductivity of the top n-type layer 150, unlike p-type layers used in current LEDs and Lasers allows for effective current spreading at small thicknesses, providing opportunities for integration of various structures above.

Although the exemplary embodiments shown herein below relate to GaN, it should be noted that, as one skilled in the art would know, the present teachings are not limited only to GaN and also apply to other III-nitrides.

Figure 2A:
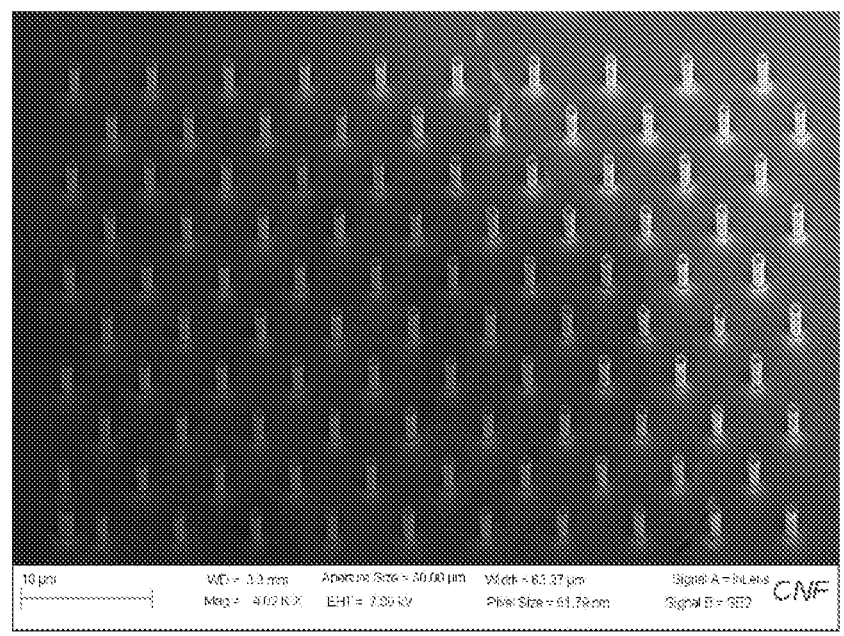
FIG. 2A shows a Scanning Electron Microscopy image of a bird's eye view of arrays of the nanopillars in one embodiment in accordance with the subject disclosure.
Figure 2B:
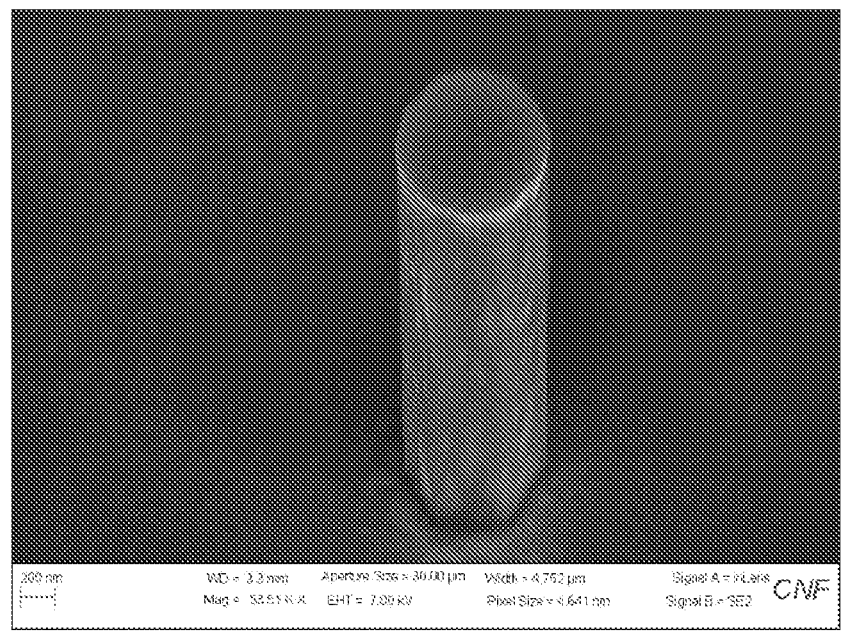
FIG. 2B shows a Scanning Electron Microscopy image of a single nanopillar in one embodiment in accordance with the subject disclosure.

FIG. 2A shows a Scanning Electron Microscopy image of the bird's eye view of arrays of the nanopillars obtained from the n-type layer of the LED structure. FIG. 2B shows a Scanning Electron Microscopy image of single nanopillar obtained from the n-type layer of the LED structure.

Figure 3:
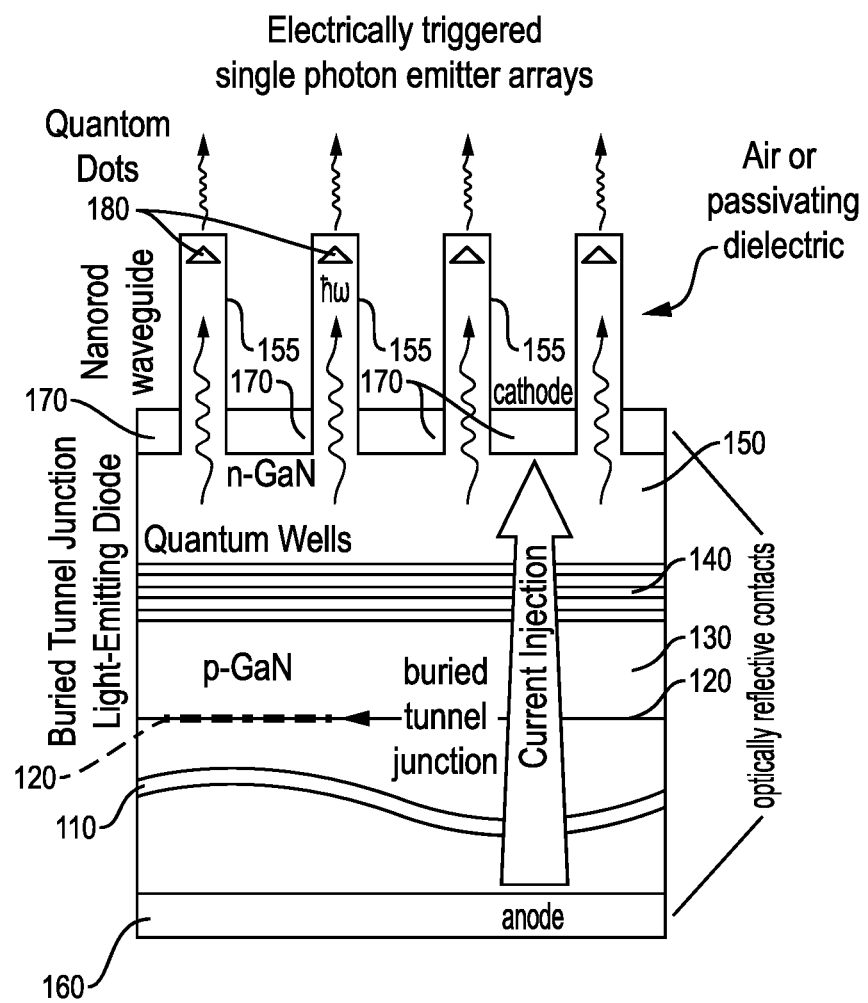
FIG. 3 is a schematic diagram of an embodiment of a device in accordance with the subject disclosure.

FIG. 3 shows an embodiment in which nanopillars and the buried tunnel junction LED allow for the direct integration of epitaxial quantum dots on the nanopillars. Referring to FIG. 3, the embodiment shown therein is based on the structure as shown in FIG. 1, in which a portion of the n type III-nitride layer 150 (n type GaN layer, as shown) is patterned, extending from above the active layer 140, into nanopillars 155. A quantum dot 180 is formed at an end of each one of the nanopillars 155 furthest from the active layer 140. (See, for example, Ž. Gačević, M. Holmes, E. Chernysheva, M. Muller, A. Torres-Pardo, P. Veit, F. Bertram, J. Christen, J. M. Gonzalez Calbet, Y. Arakawa, E. Calleja, S. Lazić, Emission of Linearly Polarized Single Photons from Quantum Dots Contained in Nonpolar, Semipolar, and Polar Sections of Pencil-Like InGaN/GaN Nanowires, ACS Photonics, 4 (2017) 657-664, and M. J. Holmes, K. Choi, S. Kako, M. Arita, Y. Arakawa, Room-temperature triggered single photon emission from a III-nitride site-controlled nanowire quantum dot, Nano Lett, 14 (2014) 982-986, both of which are incorporated by reference herein in their entirety and for all purposes.)

Figure 4:
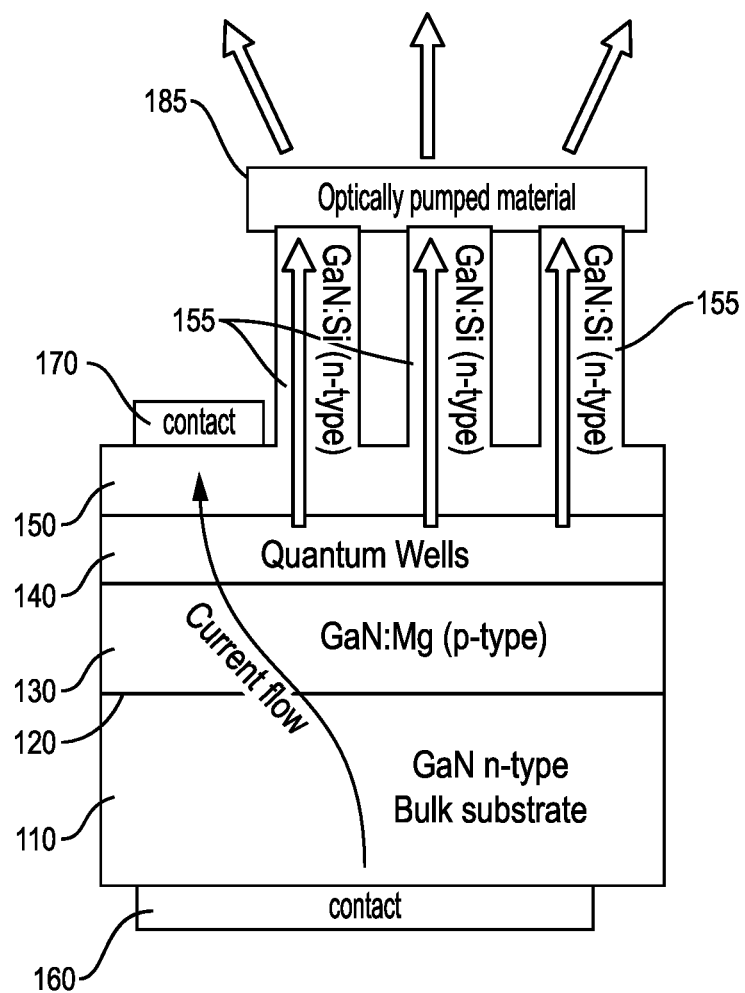
FIG. 4 is a schematic diagram of another embodiment of a device in accordance with the subject disclosure.

FIG. 4 shows an embodiment in which nanopillars and the buried tunnel junction LED allow for material configured to be optically pumped to receive emission from the nanopillars. Referring to FIG. 4, the embodiment shown therein is an embodiment of the structure as shown in FIG. 1, in which a portion of the n type III-nitride layer 150 (n type GaN layer, as shown) is patterned, extending from above the active layer 140, into nanopillars 155. A material 185 is configured to be optically pumped and is disposed to receive radiation emitted from the active layer 140. There are many examples of materials are configured to be optically pumped. A material that is configured to be optically pumped receives and absorbs the radiation emitted by the active layer and emits radiation at a different wavelength (see, for example, T. T. Tran, C. Elbadawi, D. Totonjian, C. J. Lobo, G. Grosso, H. Moon, D. R. Englund, M. J. Ford, I. Aharonovich, M. Toth, Robust Multicolor Single Photon Emission from Point Defects in Hexagonal Boron Nitride, ACS Nano, 10 (2016) 7331-7338, or Chapter 5, A. Yariv, Optical Electronics, third edition, pp. 123-139, Holt, Rinehart and Winston, Inc., 1985, both of which are incorporated by reference herein in their entirety and for all purposes).

Figure 5:
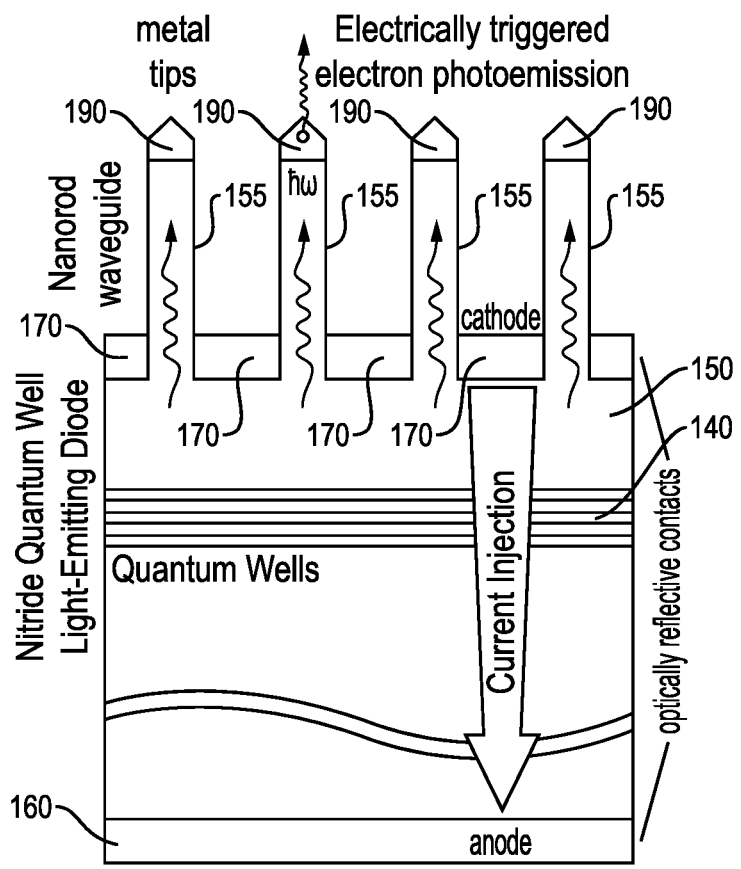
FIG. 5 is a schematic diagram of yet another embodiment of a device in accordance with the subject disclosure.

FIG. 5 shows an embodiment in which a metal layer is formed at one end furthest from the active layer of each nanopillar, and the buried tunnel junction LED allows for guiding light emitting from the active layer to the metal layer. Selection of the metal in the metal layer can result in room temperature electron emission. Referring to FIG. 5, the embodiment shown therein is an embodiment of the structure as shown in FIG. 1, in which a portion of the n type III-nitride layer 150 (n type GaN layer, as shown) is patterned, extending from above the active layer 140, into nanopillars 155. In the embodiment shown in FIG. 5, an end of each one of the nanopillars 155 furthest from the active layer 140 is covered with a metal or metal alloy to form a tip 190 (e.g. with low work function). Upon electrical injection of current into the underlying LED device, through the ohmic contacts 160, 170, the device emits light that can be waveguided into the metal tips. Because the photon energy with nitride LEDs can be larger than the work function of metals, the buried tunnel-junction platform enables a whole new generation of cold-cathode room-temperature electron emission.

In the embodiment shown in FIGS. 3, 4 and 5, at least one second ohmic contact 170 is disposed on one or more surfaces of the n-type III-nitride layer from which the nanopillars emerge. In some instances, the ohmic contacts 160, 170 are optically reflective contacts (such as, for example, but not limited to, Aluminum based contacts).

Figure 6A:
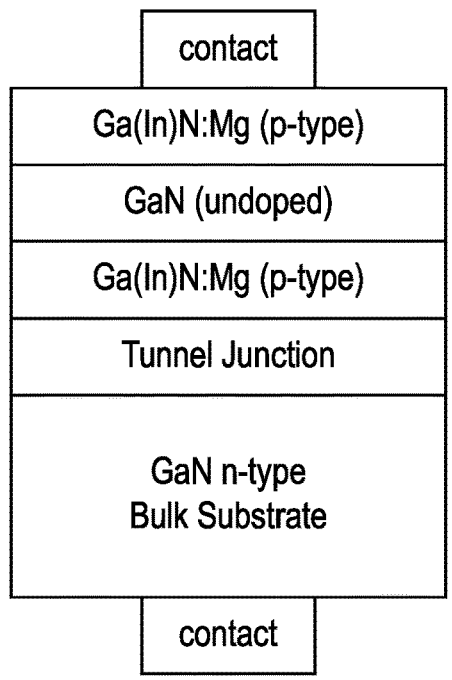
FIG. 6A is a schematic diagram of a p-channel Field effect transistor that can be integrated directly with a device in accordance with the subject disclosure.
Figure 6B:
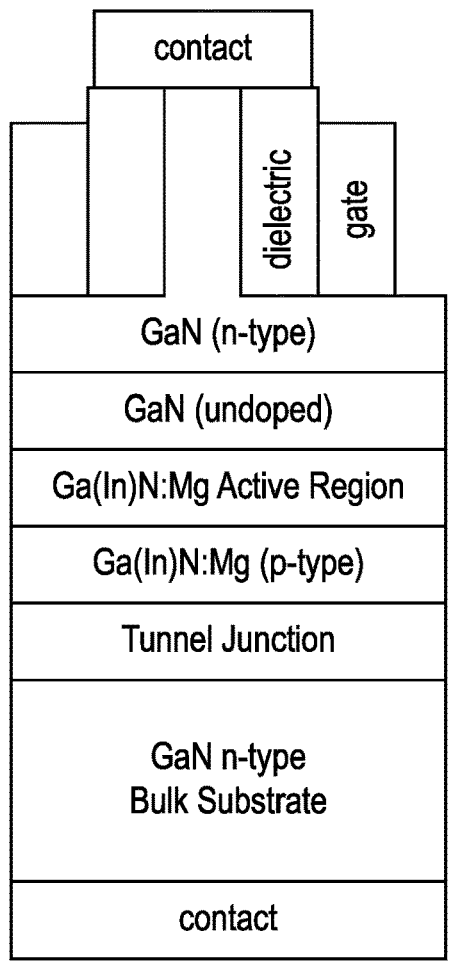
FIG. 6B is a schematic diagram of a vertical nanopillar transistor integrated with a LED or Laser.
Figure 7:
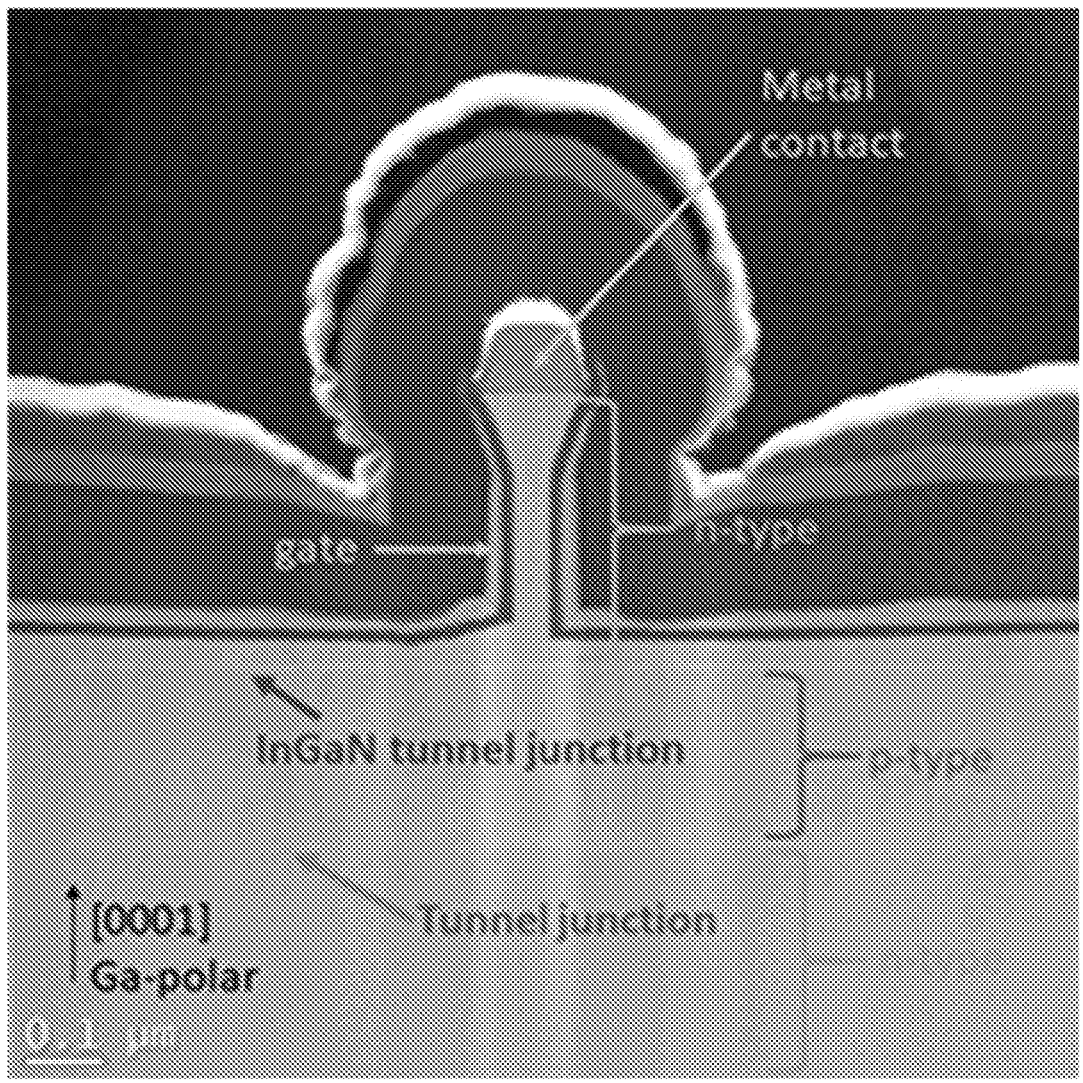
FIG. 7 is a Transmission Electron Microscopy image of cross section of an InGaN-based Tunnel Field-Effect Transistors grown on Ga-polar GaN substrate that can be integrated directly with a device in accordance with the subject disclosure.

By using the metal (III, Ga)-polar substrates and tunnel junction grown below, as in the above disclosed devices, it is possible to have easy on-chip integration of a wide range of devices. For example, growing a vertical p-channel Field-Effect Transistor, as shown in FIG. 6A (see also Alexander Chaney, Henryk Turski, Kazuki Nomoto, Qingxiao Wang, Zongyang Hu, Moon Kim, Huili Grace Xing, Debdeep Jena, Realization of the First GaN Based Tunnel Field-Effect Transistor, 2018 Device Research Conference IEEE, incorporated by reference herein is entirety and for all purposes) or other devices, enables using tunnel junction below the structure side by side with commercially mature High Electron Mobility Transistor to obtain p- and n-channel transistors on the same chip. As yet another embodiment, the structure shown in FIG. 6B shows a vertical nanopillar transistor integrated with a LED or Laser by incorporating a sidewall dielectric/metal gate. Such structures allow for individual electronic control of LED pixel arrays, or lasers and laser arrays. They allow electronic data of digital or analog kind to be directly converted into optical data. (A Transmission Electron Microscopy image of cross section of the InGaN-based Tunnel Field-Effect Transistors grown on Ga-polar GaN substrate using buried tunnel junction, marked between the n-type and p-type layers, is shown in FIG. 7. See also Alexander Chaney et al., Realization of the First GaN Based Tunnel Field-Effect Transistor, 2018 Device Research Conference IEEE.) In some embodiments, the device of these teachings and at least one other III-nitride device are integrated directly by forming the at least one other III-nitride device on the tunnel junction, In one method of using the subject technology, molecular beam epitaxy (MBE) growth of the structures is deployed. Other techniques that are able to obtain buried electrically conductive p-type layers without the need of post growth activation can also be used. The tunnel junction has a highly doped n-type layer followed by a highly doped p-type layer and can also include a layer, disposed between the n-type and p-type layer, introduced to induce polarization. On top of this buried tunnel junction, any heterostructure can be grown using MBE, or any other crystal growth method. In case of MBE growth there is no need of taking the crystal out of the reactor and the following structure can be grown in a single growth run, significantly reducing the resources and time spent in realizing the heterostructures. A preferred mode of making the device is the single growth run by MBE, which reduces the time and cost of obtaining the structure.

Because buried p-type layers grown by MOCVD (or MOVPE) can also be activated to obtain the structures.

In one embodiment, the LED with a patterned n-type III-nitride layer of these teachings is formed by growing, by a crystal growth method, a tunnel junction on a metal (III)-polar n-type III-nitride substrate, growing, by the crystal growth method, a p-type III-nitride layer on the tunnel junction, growing an active region, including at least one quantum well layer, on the p type III-nitride layer, growing an n type III-nitride layer on the active region, and etching the n type III-nitride layer in order to pattern the n type III-nitride layer into a structure.

As would be appreciated by those or ordinary skill in the pertinent art, the subject technology has many practical uses, including, but not limited to the following.

1. Reduction of metal usage and a fundamentally new method for current spreading layers for LEDs, Lasers, with easy integration of mirrors and photonic crystal structures on the top because of the low resistance compared to p-type top layers.
2. Electrically driven LED as an optical pump for other materials placed on top of the LED. For example, 2D materials transferred on top of nanopillars or other fin-type structures processed on top of LED devices because of a highly conductive top p-layer act as electrically driven room temperature single photon sources for secure quantum communications.
3. By covering nanopillars or the surface of the n-layer with metals (e.g. with low work function), electrical injection of current into the underlying LED platform emits light that can be waveguided into the metal tips. Because the photon energy with nitride LEDs can be larger than the work function of metals, the buried tunnel junction platform enables a whole new generation of cold-cathode technology for room-temperature electron emission.
4. Tunnel Field-Effect Transistors that, thanks to bottom tunnel junction, can be grown on Ga-polar substrate and easily processed in shape of nanopillars or fins with gated side walls.
5. p-channel vertical Field-Effect Transistor with bottom tunnel junction.
6. On-chip integration of devices relying on different current flow direction with respect to build-in polarization field. For example InGaN-based Tunnel Field-Effect Transistor, High Electron Mobility Transistor, and vertical field-effect transistor integrated with LED and Laser devices and arrays.

While the subject technology has been described with respect to preferred embodiments, those skilled in the art will readily appreciate that various changes and/or modifications can be made to the subject technology without departing from the spirit or scope thereof. For example, each claim, in whole or in part, may depend from any or all claims in a multiple dependent manner even though such has not been originally claimed.

The invention claimed is:

1. A device comprising:
   a metal (III)-polar III-nitride substrate having a first surface opposite a second surface;
   a tunnel junction formed on one of the first surface or a buffer layer disposed on the first surface;
   a p-type III-nitride layer formed directly on the tunnel junction;
   a number of material layers; a first material layer formed on the p-type III-nitride layer; each subsequent layer disposed on a preceding layer; wherein one layer from the number of material layers is patterned into a structure; said one layer being a III-nitride layer;
   wherein the device is an LED; wherein the first material layer is an active layer including at least one quantum well, wherein a second, and last, material layer is an n-type III-nitride layer formed directly on the active layer; a portion of the second material layer, extending from above the active layer, being patterned into nanopillars;
   wherein the metal (III)-polar III-nitride substrate is a metal (III)-polar n-type III-nitride substrate;
   wherein a first ohmic contact is disposed on the second surface of the metal (III)-polar III-nitride substrate;
   wherein at least one second ohmic contact is disposed on one or more surfaces of the n-type III-nitride layer from which the nanopillars emerge; and
   wherein material that can be optically pumped is disposed to receive emission from the nanopillars, or wherein one of a quantum dot or a metal layer is formed at an end of each one of the nanopillars furthest from the active layer.

2. The device of claim 1, wherein material that can be optically pumped is disposed to receive emission from the nanopillars.

3. The device of claim 1, wherein a quantum dot is formed at an end of each one of the nanopillars furthest from the active layer.

4. The device of claim 1, wherein a metal layer is formed at an end of each one of the nanopillars furthest from the active layer.

* * * * *